(12) United States Patent
Mizumura

(10) Patent No.: US 10,312,351 B2
(45) Date of Patent: Jun. 4, 2019

(54) LASER ANNEALING METHOD, LASER ANNEALING APPARATUS, AND MANUFACTURING PROCESS FOR THIN FILM TRANSISTOR

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-shi (JP)

(*) Notice: Subject to any disclaimer, the term of this patent is extended or adjusted under 35 U.S.C. 154(b) by 0 days.

(21) Appl. No.: 15/786,482

(22) Filed: Oct. 17, 2017

(65) Prior Publication Data

US 2018/0040718 A1    Feb. 8, 2018

Related U.S. Application Data

(63) Continuation of application No. PCT/JP2016/064345, filed on May 13, 2016.

(30) Foreign Application Priority Data

May 19, 2015  (JP) ................................. 2015-102137

(51) Int. Cl.
  *H01L 21/20*   (2006.01)
  *H01L 29/66*   (2006.01)
  (Continued)

(52) U.S. Cl.
  CPC ........ *H01L 29/66757* (2013.01); *H01L 21/20* (2013.01); *H01L 21/2026* (2013.01);
  (Continued)

(58) Field of Classification Search
  CPC ....... G06F 8/71; H04L 41/5048; H04L 67/10; H01L 29/66757; H01L 27/1229;
  (Continued)

(56) References Cited

U.S. PATENT DOCUMENTS 6,906,346 B2 *  6/2005  Nishitani ............ H01L 21/2026
                                                                257/70
8,486,812 B2 *  7/2013  Park ........................ C30B 13/22
                                                               438/487

(Continued)

FOREIGN PATENT DOCUMENTS

JP    07-187890 A    7/1995
JP    2003-045803 A  2/2003

(Continued)

OTHER PUBLICATIONS

International Preliminary Report on Patentability from PCT/JP2016/064345, dated Nov. 30, 2017, 16 pages.

*Primary Examiner* — Vu A Vu
(74) *Attorney, Agent, or Firm* — Morgan, Lewis & Bockius LLP

(57) ABSTRACT

The present invention provides a laser annealing method for irradiating laser light L to an amorphous silicon thin film deposited on a substrate to obtain polysilicon, the method including: multiply irradiating the laser light L while changing an irradiation area of the laser light L on the amorphous silicon thin film to achieve such a grain size distribution that a crystal grain size of the polysilicon decreases from a central portion to a side edge portion at least along a center line C of the irradiation area of the laser light L. The above laser annealing method can reduce a leak current through a simple process.

3 Claims, 10 Drawing Sheets

(51) Int. Cl.
    *H01L 21/268*     (2006.01)
    *H01L 27/12*     (2006.01)
    *H01L 29/786*     (2006.01)

(52) U.S. Cl.
    CPC ........ *H01L 21/268* (2013.01); *H01L 27/1229* (2013.01); *H01L 27/1285* (2013.01); *H01L 29/66765* (2013.01); *H01L 29/78675* (2013.01); *H01L 29/78696* (2013.01)

(58) Field of Classification Search
    CPC ......... H01L 29/78696; H01L 29/66765; H01L 27/1285; H01L 29/78675; H01L 21/2026; H01L 21/268; H01L 21/20
    USPC ....................................................... 438/487
    See application file for complete search history.

(56) References Cited

U.S. PATENT DOCUMENTS

2002/0197759 A1     12/2002   Yang
2005/0079693 A1     4/2005   Kang et al.

FOREIGN PATENT DOCUMENTS

| | | |
|---|---|---|
| JP | 2005-510063 A | 4/2005 |
| JP | 2007-335780 A | 12/2007 |
| JP | 2012-004250 A | 1/2012 |
| JP | 2013-157549 A | 8/2013 |

\* cited by examiner

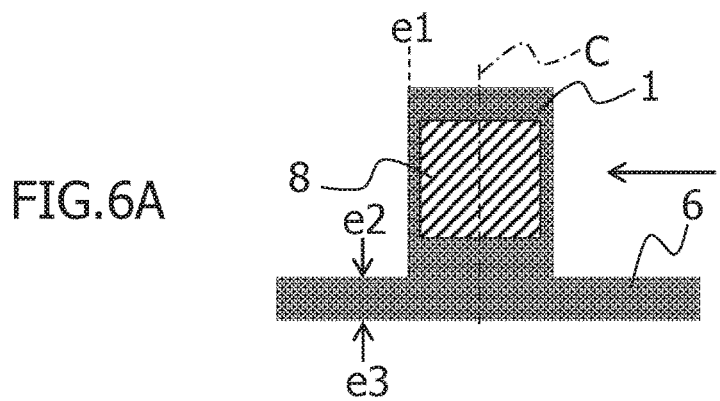
FIG.6A
FIG.6B
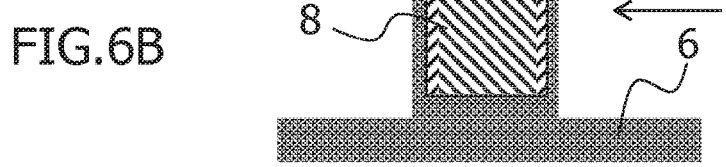
FIG.6C
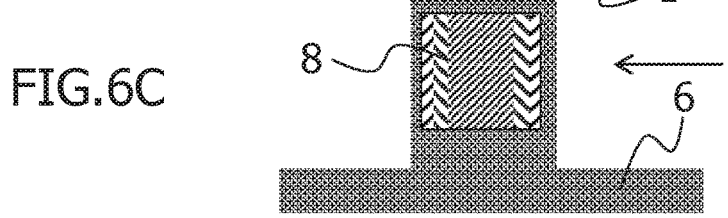
FIG.6D
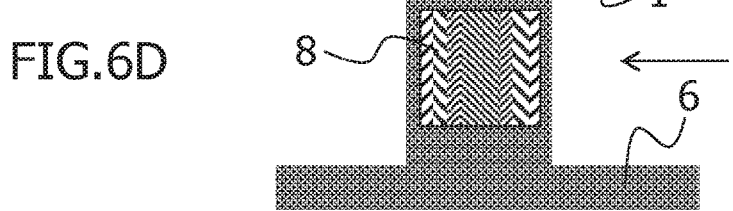
FIG.6E
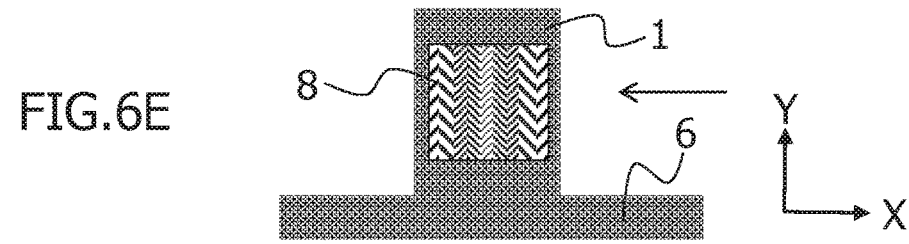

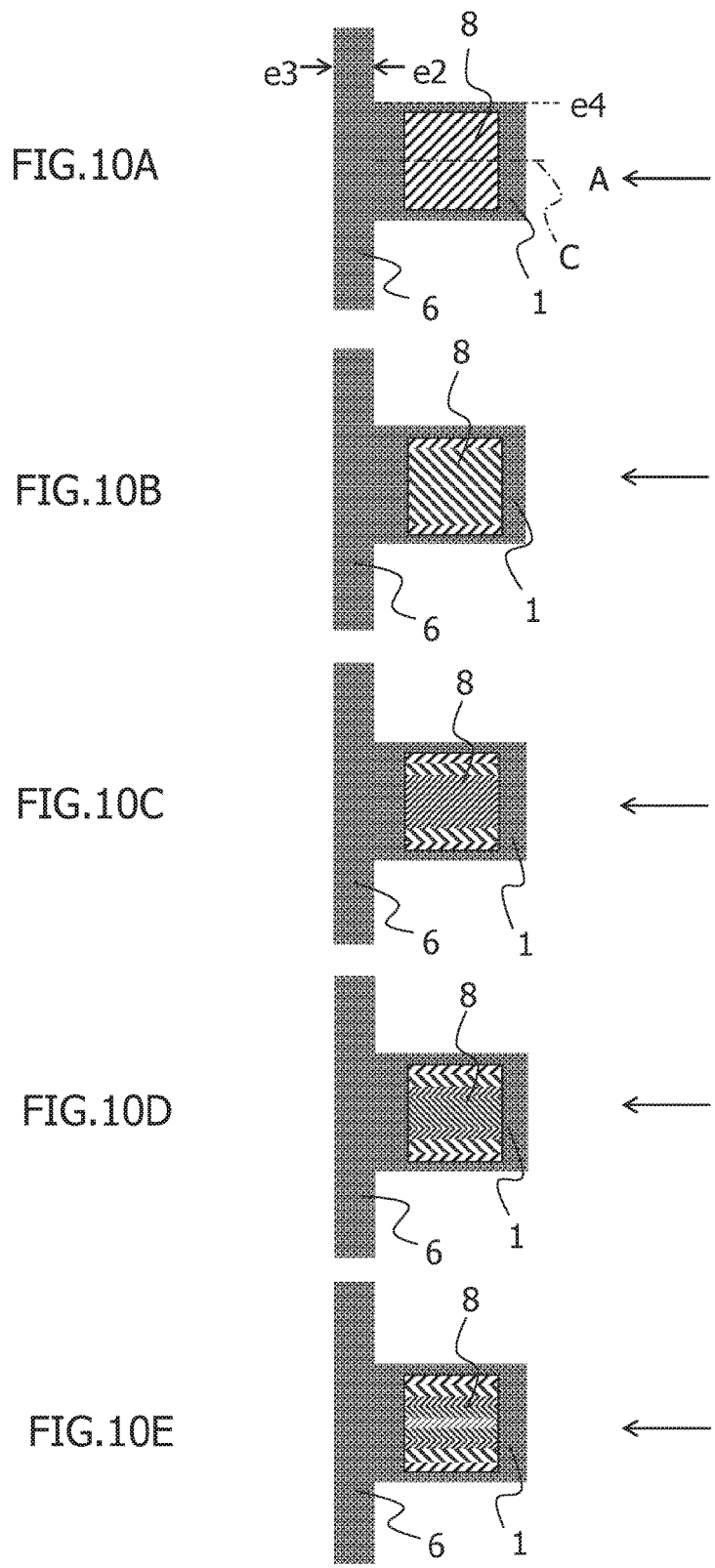

LASER ANNEALING METHOD, LASER ANNEALING APPARATUS, AND MANUFACTURING PROCESS FOR THIN FILM TRANSISTOR

CROSS-REFERENCE TO RELATED APPLICATIONS

This application is a continuation application of PCT/JP2016/064345, filed on May 13, 2016, which claims priority to Japanese Patent Application No. 2015-102137, filed on May 19, 2015, all of which are hereby incorporated by reference in their entirety for all purposes.

BACKGROUND OF THE INVENTION

1. Field of the Invention

The present invention relates to a laser annealing method for an amorphous silicon thin film, and more particularly, relates to a laser annealing method, a laser annealing apparatus, and a manufacturing process for a thin film transistor, which can reduce a leak current in the thin film transistor.

2. Description of Related Art

In general, thin film transistors (hereinafter referred to as "TFTs") have a structure in which a gate electrode, a source electrode, a drain electrode, and a semiconductor layer are laminated. In such a structure, a TFT having a polysilicon thin film as the semiconductor layer excels in electron mobility and finds its application in low power displays. It is conventionally known that in a manufacturing process for a TFT substrate, amorphous silicon deposited into a film on the TFT substrate is crystallized into a polysilicon (polycrystalline silicon) film by laser annealing, for example, see, Japanese Patent Application Laid-open Publication No. 2007-335780.

SUMMARY OF THE INVENTION

Conventional laser annealing treatment for a TFT substrate, however, irradiates the entire surface of the TFT substrate with, for example, UV laser light for uniform laser annealing. In this case, since a polysilicon film is formed in regions below the source and drain electrodes as well, an electric field intensity is accordingly increased, making it difficult to reduce a so-called leak current (off current) generated when the TFT is turned off. In order to deal with such a problem, an LDD (Lightly Doped Drain) structure, for example, is adopted, but it requires a complicated manufacturing process and is expensive.

In view of the above problem, an object of the present invention is to provide a laser annealing method, a laser annealing apparatus, and a TFT manufacturing process, which can reduce a leak current through a simple process.

In order to attain the above object, the present invention provides a laser annealing method for irradiating laser light to an amorphous silicon thin film deposited on a substrate to obtain polysilicon, the method comprising: multiply irradiating the laser light while changing an irradiation area of the laser light on the amorphous silicon thin film to achieve such a grain size distribution that a crystal grain size of polysilicon decreases from a central portion to a side edge portion at least along a center line of the irradiation area of the laser light.

Also, the present invention provides a laser annealing apparatus for executing laser annealing on an amorphous silicon thin film in a region corresponding to a gate electrode on a substrate to form a semiconductor layer of a thin film transistor (TFT), the apparatus comprising: an optical system configured to multiply irradiate laser light while changing an irradiation area of the laser light such that the amorphous silicon thin film in regions corresponding to a source electrode and a drain electrode, respectively are irradiated with a smaller irradiation amount than the amorphous silicon thin film in a channel region between the source electrode and the drain electrode; and control means configured to control the optical system to change the irradiation area of the laser light.

Also, the present invention provides a manufacturing process for a thin film transistor (TFT) that includes a gate electrode, a source electrode, a drain electrode and a semiconductor layer, which are laminated on a substrate, the process comprising: a laser annealing step for irradiating laser light to an amorphous silicon thin film deposited on the substrate, in a region corresponding to the gate electrode to form a polysilicon thin film as the semiconductor layer, wherein the step is executed by multiply irradiating the laser light while changing an irradiation area of the laser light such that the amorphous silicon thin film in regions corresponding to the source electrode and the drain electrode, respectively are irradiated with a smaller irradiation amount than the amorphous silicon thin film in a channel region between the source electrode and the drain electrode.

According to the present invention, it is possible to achieve such a grain size distribution that a crystal grain size of polysilicon is decreased from a central portion toward a side edge portion at least along a center line of an irradiation area of laser light only by executing a simple process of multiply irradiating the laser light while changing an irradiation area of the laser light on an amorphous silicon thin film.

Owing to the above grain size distribution, as crystallization is suppressed from the central portion to the side edge portion, the resistance increases, so a leak current can be reduced.

BRIEF DESCRIPTION OF THE DRAWINGS

FIGS. 6A to 6E are plan views illustrating an example of the TFT manufacturing process of the present invention.

FIGS. 10A to 10E are plan views illustrating an example of the TFT manufacturing process of the present invention.

DESCRIPTION OF PREFERRED EMBODIMENTS

Figure 1:
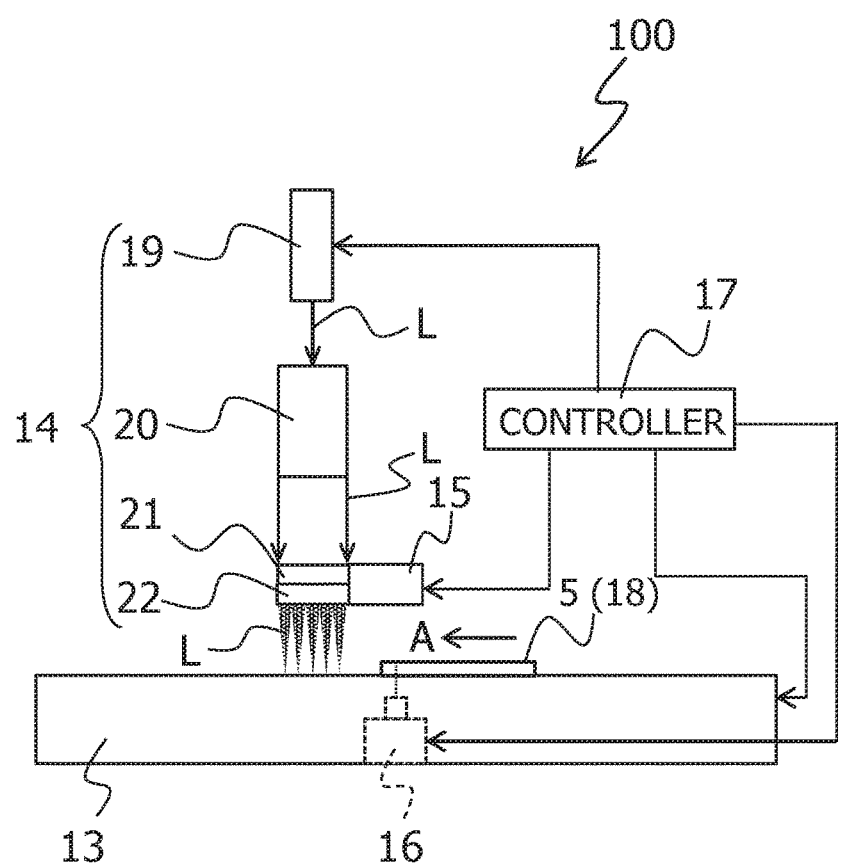
FIG. 1 is a schematic diagram showing an embodiment of a laser annealing apparatus according to the present invention.
Figure 2:
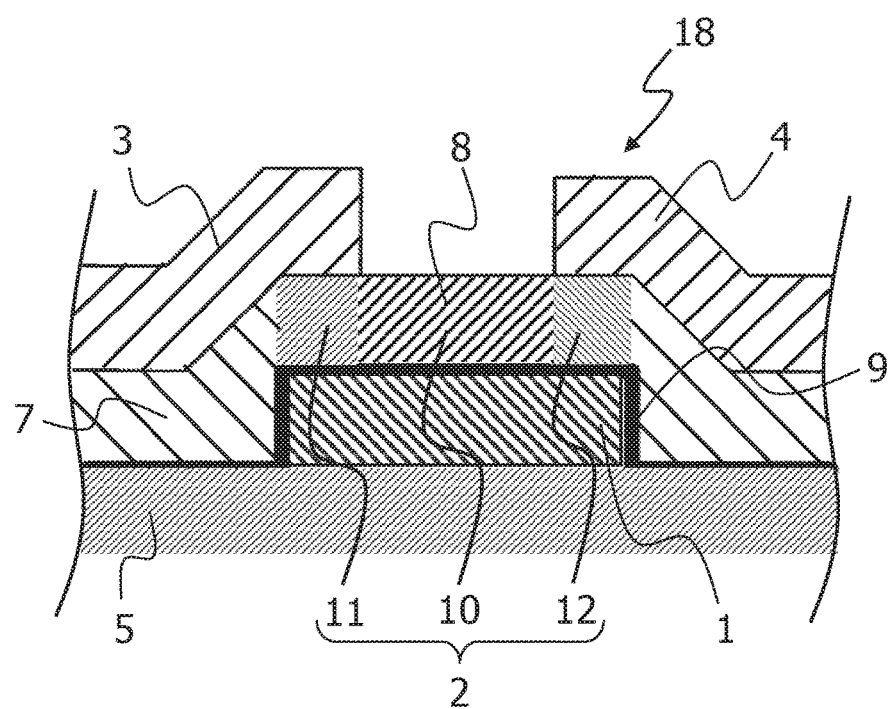
FIG. 2 is a cross-sectional view of an embodiment of a TFT manufactured by the laser annealing apparatus of the present invention.

Embodiments of the present invention will be described below in detail with reference to the accompanying drawings. FIG. 1 is a schematic diagram showing an embodiment of a laser annealing apparatus of the present invention. FIG. 2 is a cross-sectional view showing an embodiment of a TFT manufactured by the laser annealing apparatus of the present invention. A laser annealing apparatus 100 of FIG. 1 performs laser annealing on an amorphous silicon thin film in a region corresponding to a gate electrode on a TFT substrate 5 to form a semiconductor layer of a TFT 18.

More specifically, the laser annealing apparatus 100 includes a conveyance means 13, a laser illumination optical system 14, an alignment means 15, an image capture means 16, and a controller 17. Note that the laser illumination optical system 14 is an example of an optical system, and the controller 17 is an example of a control means. Also, the TFT substrate 5 is an example of a substrate applicable in this embodiment. In the TFT substrate, gate electrodes of the TFTs 18 are provided at intersections (not shown) where plural data lines and gate lines crisscross each other.

The conveyance means 13 conveys the TFT substrate 5, on the top of which an amorphous silicon thin film is formed, in a predetermined direction. For example, the conveyance means 13 can position and place the TFT substrate 5 such that the gate line extends in parallel to the conveyance direction (the direction of arrow A).

Here, as shown in FIG. 2, each TFT 18 is used to drive a pixel electrode of a display and equipped with a gate electrode 1, a semiconductor layer 2, a source electrode 3, and a drain electrode 4.

The plural gate electrodes 1 are formed in a matrix at regular array pitches on the TFT substrate 5 in the form of transparent glass, for example, and also are electrically connected to plural gate lines 6 (see FIGS. 6A to 6E) extending in parallel to the horizontal direction of the TFT substrate 5 so as to receive scanning information from a gate drive circuit provided outside a display area.

Also, the semiconductor layer 2 is formed over the gate electrode 1. The semiconductor layer 2 of this embodiment includes a polysilicon thin film 8 formed by executing laser annealing on an amorphous silicon thin film 7 deposited on the TFT substrate 5 in such a manner that UV laser light L (see FIG. 1) is irradiated to at least a region corresponding to the gate electrode 1 out of the amorphous silicon thin film 7. Note that an insulating film 9 is formed between the semiconductor layer 2 and the gate electrode 1. Also, in this structure, a crystal grain size of the polysilicon thin film 8 is smaller in regions corresponding to the source electrode 3 and the drain electrode 4, respectively than the polysilicon thin film 8 in a channel region 10 between the source electrode 3 and the drain electrode 4.

More specifically, the semiconductor layer 2 is formed such that the laser light L is irradiated to the amorphous silicon thin film 7 with a smaller irradiation amount in regions corresponding to the source electrode 3 and the drain electrode 4, respectively than the amorphous silicon thin film 7 in the channel region 10, for example. Hereinafter, the regions of the semiconductor layer 2 corresponding to the source electrode 3 and the drain electrode 4 are referred to as a "source region 11" and a "drain region 12", respectively.

Also, in the semiconductor layer 2, the source electrode 3 is formed on one end side of the gate electrode 1. The source electrode 3 is electrically connected to an unillustrated data line crossing the gate line 6 and adapted to receive a data signal from a source drive circuit provided outside the display area.

Furthermore, in the semiconductor layer 2, the drain electrode 4 is formed on the other end side of the gate electrode 1. The drain electrode 4 supplies to an unillustrated pixel electrode of the display a data signal received via the data line and the source electrode 3. The drain electrode 4 is electrically connected to the pixel electrode. Also, an unillustrated protective film is provided as the insulating film 9 on the source electrode 3 and the drain electrode 4.

Referring back to FIG. 1, the laser illumination optical system 14 is disposed above the conveyance means 13. The laser illumination optical system 14 irradiates the laser light L onto the amorphous silicon thin film 7 of the TFT substrate 5. More specifically, the laser illumination optical system 14 multiply irradiates the laser light L to the amorphous silicon thin film 7 while changing an irradiation area of the laser light L so that the irradiation amount becomes smaller in the amorphous silicon thin film 7 in the regions corresponding to the source electrode 3 and drain electrode 4, respectively in the TFT 18 of FIG. 2 than the amorphous silicon thin film 7 in the channel region 10 between the source electrode 3 and the drain electrode 4. That is, the laser illumination optical system 14 can crystallize the amorphous silicon thin film 7 on the gate electrode 1 into polysilicon as the semiconductor layer 2.

Here, the laser illumination optical system 14 includes a laser 19, and a coupling optical system 20, a photo mask 21, and a microlens array 22 arranged in the stated order in the travel direction of the laser light L emitted from the laser 19. The laser 19 emits pulsed UV laser light L. To give an example thereof, a YAG (Yttrium Aluminum Garnet) laser having the wavelength of 355 nm and an excimer laser having the wavelength of 308 nm can be used.

Also, the coupling optical system 20 serves to expand and homogenize the laser light L emitted from the laser 19 and then irradiate the resultant light to the photo mask 21. The coupling optical system 20 includes, although not shown, optical devices such as a beam expander, a photointegrator, and a collimator lens, for example.

Moreover, the photo mask 21 has plural apertures of different sizes and splits one laser light L into plural beams of laser light L. This structure makes it easy to multiply irradiate the laser light L in this embodiment.

Figure 3A:
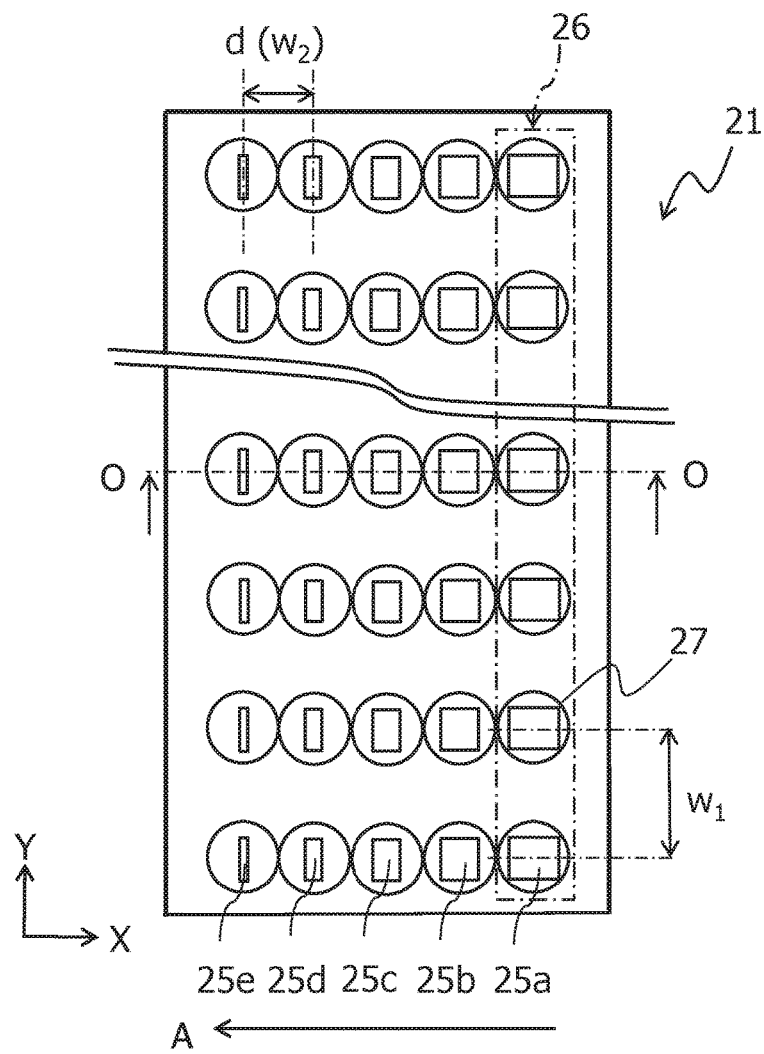
FIGS. 3A and 3B show a structural example of a photo mask and a microlens array that are used in the laser annealing apparatus of the present invention.
Figure 3B:
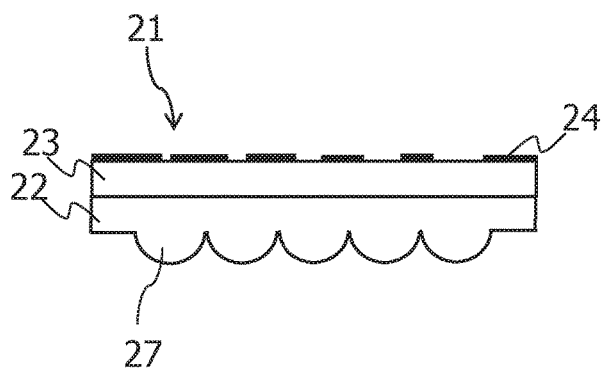

FIGS. 3A and 3B show a structural example of the photo mask and microlens array used in the laser annealing apparatus of the present invention. FIG. 3A is a plan view thereof, and FIG. 3B is a cross-sectional view taken along line O-O of FIG. 3A. As shown in FIG. 3B, a light shielding film 24 made of chromium (Cr), aluminum (Al), or the like is formed on a transparent quartz substrate 23 in the photo mask 21, and the light shielding film 24 has plural apertures of different sizes so as to shape the laser light L to be irradiated onto the TFT substrate 5.

Specifically, as shown in FIG. 3A, the photo mask 21 has apertures of the same size arranged in line at an array pitch $w_1$ for the gate electrodes 1 in the direction (Y direction) crossing the conveyance direction (the direction of arrow A) of the TFT substrate 5, for example. Also, the photo mask 21 has plural apertures 25a to 25e of different sizes at the same pitch as the array pitch $w_2$ for the gate electrodes 1 in the same direction (X direction) as the conveyance direction.

More specifically, suppose that the laser light L is applied for laser annealing in n shots (n is a positive integer). Provided that n=5, for example, five rows of apertures of different sizes are formed at the array pitch $w_2$ in the conveyance direction. For example, a set of apertures 25a surrounded by the dashed and single-dotted line of FIG. 3A makes one row (hereinafter referred to as "aperture row 26"). Likewise, the other sets of apertures, i.e., apertures 25b to 25e each make one row. Furthermore, the size of the most upstream aperture 25a in the conveyance direction is set such that an irradiation area of the laser light L having passed the aperture 25a becomes substantially equal to a plane area of the gate electrode 1, for example. The size of each aperture is gradually decreased to the downstream side in the conveyance direction. The size of the most downstream aperture 25e is set such that the irradiation area of the laser light L having passed the aperture 25e becomes smaller than a plane area of the channel region 10 between the source electrode 3 and the drain electrode 4.

Note that in this embodiment, the apertures have the same width in the direction (Y direction) crossing the conveyance direction (so that the irradiation area of the laser light L having passed each aperture has substantially the same width in the same direction as the width of the gate electrode 1 in the same direction). The apertures have different widths in the conveyance direction (X direction). The aperture size is changed in this way.

The microlens array 22 includes plural microlenses 27 that can align their optical axes with the centers of the respective apertures, and focus a reduced image of each aperture on a region corresponding to the gate electrode 1.

Referring back to FIG. 1, the alignment means 15 is used to appropriately irradiate the laser light L onto a target position, and move the photo mask 21 and the microlens array 22 following the motions of the TFT substrate 5 that is conveyed, for example, swaying right and left with respect to the conveyance direction.

The conveyance means 13 includes an image capture means 16 below the conveyance surface. The image capture means 16 captures images of the gate electrode 1 and the gate line 6 formed on the surface of the TFT substrate 5 through from the back of the TFT substrate 5. The image capture means 16 is a line camera having an elongated light receiving surface where plural light receiving elements are arranged in line in the direction crossing the conveyance direction, for example. Also, the line camera is disposed such that the longitudinal center line of the light receiving surface matches the center line of the most upstream aperture row 26 in the conveyance direction (the direction of arrow A) of the photo mask 21, for example, so as to capture an image of a portion apart from the above aperture row 26 by a predetermined distance.

The controller 17 executes control over the conveyance means 13, the laser illumination optical system 14, the alignment means 15, and the image capture means 16. Note that the conveyance means 13, the laser illumination optical system 14, the alignment means 15, the image capture means 16, and the controller 17 are electrically connected. The controller 17 switches apertures of the photo mask 21 to control how the irradiation area of the laser light L is changed. More specifically, the controller 17 controls an irradiation amount of the laser light L so as to perform laser annealing on the source region 11 and the drain region 12 with a smaller irradiation amount of the laser light L than the channel region 10. Thus, the controller 17 can reduce a crystal grain size of the polysilicon thin film 8 in regions corresponding to the source electrode 3 and the drain electrode 4, respectively of the TFT substrate 5, compared with the polysilicon thin film 8 in the channel region 10 between the source electrode 3 and the drain electrode 4.

More specifically, the controller 17 moves the gate electrode 1 to be irradiated, sequentially from a position right below the aperture 25a of the photo mask 21 toward a position right below the aperture 25e upon each irradiation. In other words, the controller 17 controls an amount of stepwise movement so as to stepwise move the TFT substrate 5 by a distance d (array pitch $w_2$). In this way, the channel region 10 is multiply irradiated with the laser light L having passed the different apertures. That is, the channel region 10 can have an irradiation amount distribution of the laser light L.

Figure 4:
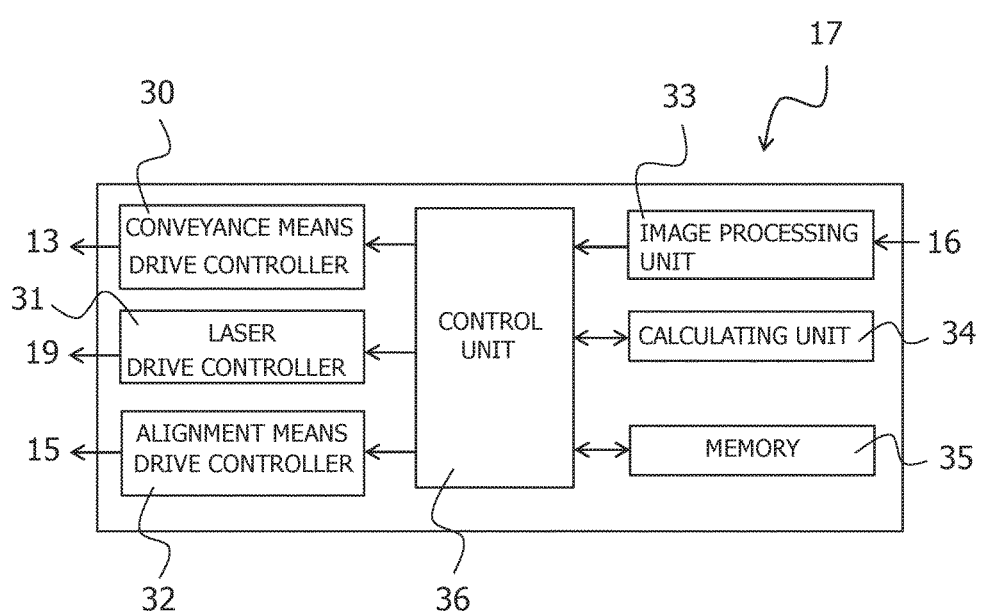
FIG. 4 is a block diagram showing a structural example of control means in the laser annealing apparatus of the present invention.

FIG. 4 is a block diagram showing one structural example of a control means in the laser annealing apparatus of the present invention. The controller 17 includes a conveyance means drive controller 30, a laser drive controller 31, an alignment means drive controller 32, an image processing unit 33, a calculating unit 34, a memory 35, and a control unit 36.

Here, the conveyance means drive controller 30 controls driving of the conveyance means 13 so as to move the TFT substrate 5 at a predetermined, constant speed in the direction of arrow A. Furthermore, the laser drive controller 31 controls driving of the laser 19 so as to emit pulsed laser light L at predetermined time intervals. In addition, the alignment means drive controller 32 controls the alignment means 15.

The image processing unit 33 detects as first detection information an edge portion (boundary of the gate electrode 1 in the Y direction (for example, line e1 of FIG. 6A)) of the gate electrode 1 that crosses the conveyance direction, in accordance with luminance change in the conveyance direction based on image information captured by the image capture means 16. Also, the image processing unit 33 detects as second detection information positions of the edge portions of the gate line 6 (for example, lines e2 and e3 of FIG. 6A) extending in parallel to the conveyance direction, in accordance with luminance change in the direction crossing the conveyance direction (luminance change in the longitudinal axis direction of the light receiving surface). The image processing unit 33 outputs the first detection information, the second detection information, and reference positional information preset in the image capture means 16 to the calculating unit 34.

The calculating unit 34 first receives the first detection information and the second detection information from the image processing unit 33, and then calculates the distance the TFT substrate 5 moves from the time of detection. Next, the calculating unit 34 determines whether the irradiation position of the laser light L corresponding to the aperture(s) 25a of the most upstream aperture row 26 of the photo mask 21 in the conveyance direction matches the first irradiation position along with the conveyance of the TFT substrate 5 so that the moving distance of the TFT substrate 5 matches a target value thereof. If both are matched, the calculating unit 34 outputs to the laser drive controller 31 a command to emit one pulse (one shot) of laser light L.

Also, comparing the positional information of the edge portion of the previously chosen gate line 6 out of the received positional information of the edge portions of the gate lines 6 in the direction parallel to the conveyance direction with the reference positional information, the calculating unit 34 calculates the distance therebetween and in turn calculates a difference between the distance and an alignment target value to output information about the difference (offset information) to the alignment means drive controller 32. Thus, the alignment means drive controller 32 drives the alignment means 15 so as to correct the offset based on the offset information.

The memory 35 is a rewritable storage device that stores a conveyance speed of the TFT substrate 5, the above target values, etc. The control unit 36 includes a processor and executes control over the entire apparatus to ensure appropriate operations of the above components.

As mentioned above, the laser annealing apparatus 100 can provide a means for reducing a leak current generated when the TFT is turned off, by executing step(s) of a laser annealing method as described below with the above structure by means of a simple process.

Next, a description is given of a TFT manufacturing process that is executed using the laser annealing apparatus 100. The TFT manufacturing process according to the present invention is a manufacturing process for a TFT including the gate electrode 1, the source electrode 3, the drain electrode 4, and the semiconductor layer 2 which are laminated on the TFT substrate 5. The TFT manufacturing process includes step(s) of the laser annealing method (hereinafter referred to as "laser annealing step") which irradiates the laser light L to the amorphous silicon thin film 7 deposited on the TFT substrate 5 in a region corresponding to the gate electrode 1 so as to form a polysilicon thin film as the semiconductor layer 2.

In the laser annealing step, the laser light L is multiply irradiated while an irradiation area of the laser light L is changed so that the laser light is applied to the amorphous silicon thin film 7 in regions corresponding to the source electrode 3 and the drain electrode 4, respectively with a smaller irradiation amount than the amorphous silicon thin film 7 in the channel region 10. Preferably, the irradiation area of the laser light L is changed by switching the apertures of the photo mask 21.

Note that a TFT prepared by the TFT manufacturing process (for example, TFT 18 of FIG. 2) basically has the same structure as a well-known TFT structure except the structure of the semiconductor layer 2. Accordingly, a conventional manufacturing process is applied to the basic structure. On this account, only the formation of the semiconductor layer 2 not taught by the conventional technique, especially, the laser annealing step is described below.

In the laser annealing step of the TFT manufacturing process, the laser light L is multiply irradiated while changing the irradiation area of the laser light L as described above, so as to attain such a grain size distribution that a crystal grain size of poly silicon decreases from a central portion to a side edge portion at least along the center line of the irradiation area of the laser light L.

For example, in the laser annealing step, the apertures of the photo mask 21 are switched for multiple irradiation of the laser light L each time the TFT substrate 5 is moved stepwise. In other words, in the laser annealing step, the laser light L is allowed to sequentially pass the plural apertures 25a to 25e of different sizes, whereby a predetermined channel region 10 can be irradiated with different irradiation amounts of laser light.

More specifically, in the above laser annealing step, when the laser light L is applied in n shots (n is an integer not smaller than three, for example) for laser annealing, an amount of stepwise movement of the irradiation position of the laser light L is set equal to a distance d (array pitch $w_2$).

Note that the distance d also corresponds to a width of the channel region 10 in the conveyance direction.

Referring to FIGS. 5A to 5E and FIGS. 6A to 6E, the laser annealing step is described below. The laser is, for example, a YAG laser. FIGS. 5A to 5E are cross-sectional views illustrating an example of the TFT manufacturing process of the present invention. FIGS. 6A to 6E are plan views illustrating an example of the TFT manufacturing process of the present invention. In the following example, the laser light L is applied in five shots, for example, for laser annealing.

Figure 5A:
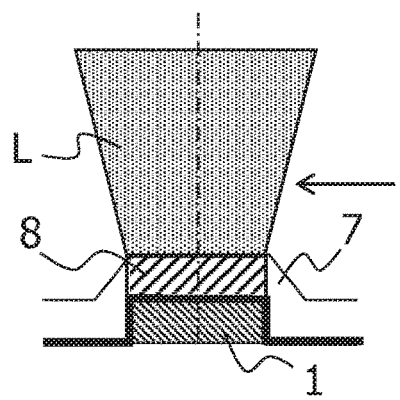
FIGS. 5A to 5E are cross-sectional views illustrating an example of a TFT manufacturing process according to the present invention.
Figure 5B:
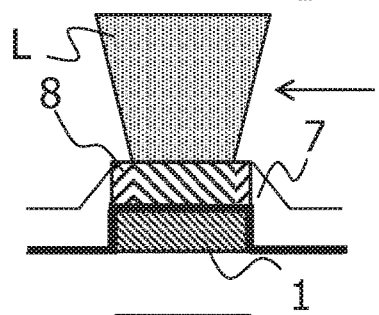
Figure 5C:
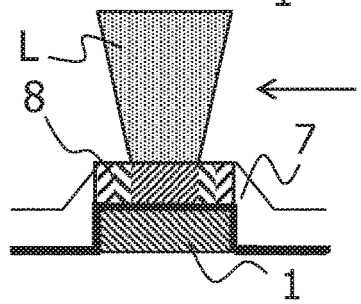
Figure 5D:
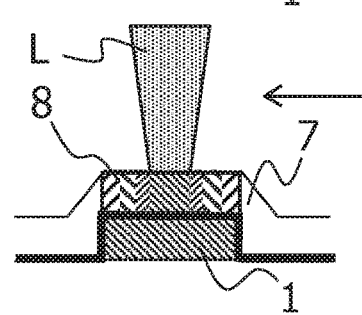
Figure 5E:
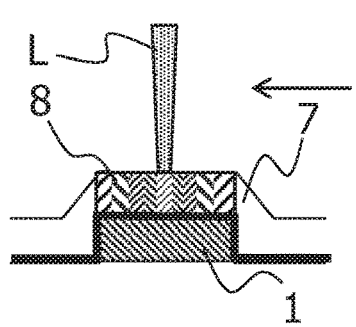

The controller 17 first moves the TFT substrate 5 in the direction of arrow A of FIG. 1 and then positions and stops the substrate in the first irradiation position as mentioned above. Next, as shown in FIG. 5A and FIG. 6A, the controller 17 irradiates to the amorphous silicon thin film 7, especially, the channel region 10 of the gate electrode 1, one shot (first shot) of the laser light L shaped through the aperture 25a to enable irradiation onto the amorphous silicon thin film 7 in conformity with the channel region 10. As a result, a portion that is irradiated with the laser light L, of the amorphous silicon thin film 7 is instantaneously heated and melted, and silicon molecular bonds are changed from the amorphous structure to the polycrystalline one to obtain the polysilicon thin film 8. Note that a center line C of the irradiation area of the laser light L is illustrated in FIG. 6A. The controller 17 performs multiple irradiation so as to achieve such a grain size distribution that a crystal grain size of polysilicon decreases from the central portion toward the side edge portion at least along the center line C of the irradiation area of the laser light L as described below.

Next, the controller 17 changes the irradiation area of the laser light L with respect to the previously irradiated polysilicon thin film 8 to stepwise move the TFT substrate 5 for current irradiation by the distance d in the direction of arrow in FIG. 3A. After that, one shot (second shot; see FIG. 5B and FIG. 6B) of the laser light L shaped through the aperture 25b is applied in the same way as above.

An overlap between the first and second shots of the laser light L (overlapped irradiation area that has been irradiated with the first and second shots) has been exposed to a larger irradiation amount of laser light L than the portion exposed to the first shot alone. At such an overlap (overlap between the previous and current shots), crystallization (crystal growth) proceeds. Consequently, the crystal grain size of the poly silicon thin film 8 at such an overlap is larger than the other portion of the polysilicon thin film 8.

Next, the controller 17 changes the irradiation area of the laser light L for the previously irradiated polysilicon thin film 8, and moves the TFT substrate 5 stepwise by the distance d for current irradiation. After that, one shot (third shot; see FIG. 5C and FIG. 6C) of the laser light L shaped through the aperture 25c is applied in the same way as above.

An overlap among the three shots, or the first to third shots, of the laser light L has been exposed to a larger irradiation amount of laser light L than the portion exposed to the two shots of laser light L. At such an overlap (overlap among the previous and current shots), crystallization further proceeds. Consequently, the crystal grain size of the polysilicon thin film 8 at such an overlap is much larger than the other portion of the polysilicon thin film 8.

Furthermore, the controller 17 changes the irradiation area of the laser light L for the previously irradiated polysilicon thin film 8, and moves the TFT substrate 5 stepwise by the distance d for current irradiation. After that, one shot (fourth shot; see FIG. 5D and FIG. 6D) of the laser light L shaped through the aperture 25d is applied in the same way as above.

An overlap among the four shots, or the first to fourth shots, of the laser light L has been exposed to a larger irradiation amount of laser light L than the portion exposed to the three shots of laser light L. At such an overlap (overlap among the previous and current shots), crystallization further proceeds. Consequently, the crystal grain size of the polysilicon thin film 8 at such an overlap is much larger than the other portion of the polysilicon thin film 8.

Moreover, the controller 17 changes the irradiation area of the laser light L for the previously irradiated polysilicon thin film 8, and moves the TFT substrate 5 stepwise by the distance d for the final irradiation. After that, one shot (fifth shot; see FIG. 5E and FIG. 6E) of the laser light L shaped through the aperture 25e is applied in the same way as above.

As this point, the laser annealing for the amorphous silicon thin film 7 in the region corresponding to the gate electrode 1 is completed to form the polysilicon thin film 8 as the semiconductor layer 2.

Figure 7:
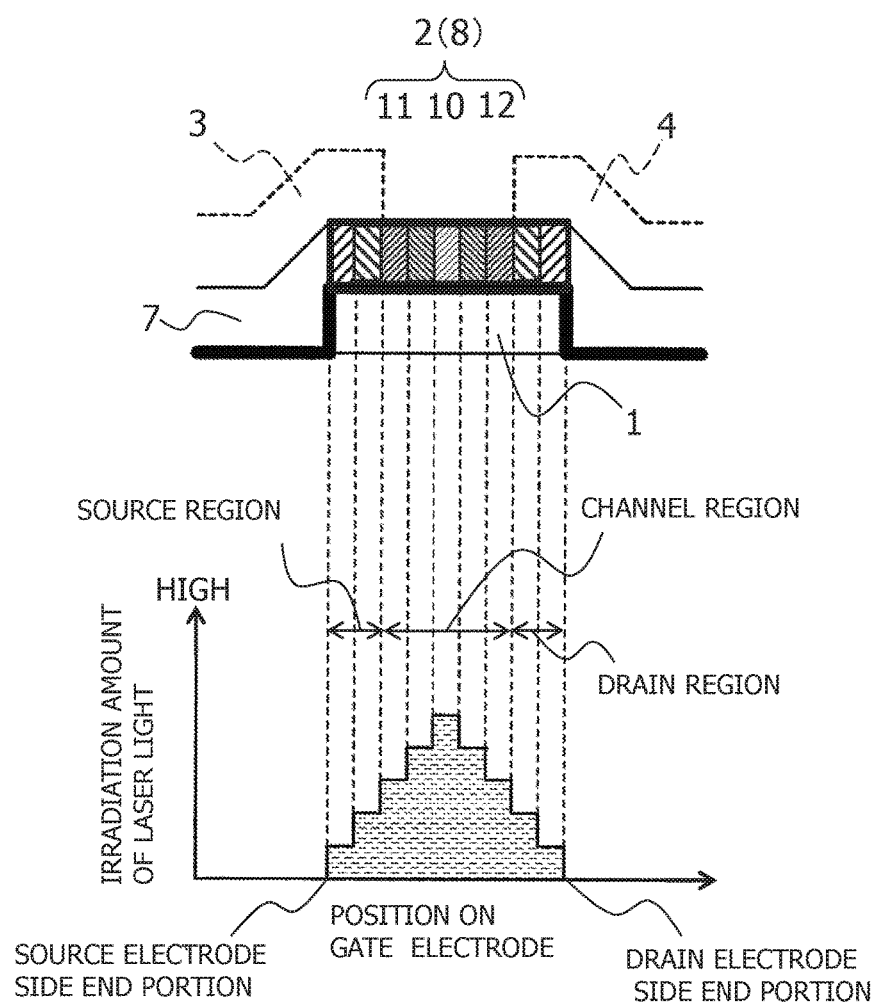
FIG. 7 is an explanatory view showing an irradiation amount distribution of laser light in the TFT manufacturing process of the present invention.

FIG. 7 is an explanatory view showing an irradiation amount distribution of the laser light in the TFT manufacturing process of the present invention. As shown in FIG. 7, an overlapped irradiation area that has been irradiated with the five shots, i.e., the first to fifth shots of laser light L (central portion of the channel region 10) has been exposed to a much larger irradiation amount of laser light L than the portion exposed to the four shots of laser light L. At such an overlap, crystallization (crystal growth) further proceeds. Consequently, the crystal grain size of the polysilicon thin film 8 at such an overlap is much larger than the other portion of the polysilicon thin film 8.

Moreover, the number of overlapped shots (i.e., overlapped areas irradiated with the laser light L) reduces from the central portion of the channel region 10 toward its edge portion on the drain electrode 4 side, and thus, the irradiation amount of laser light L is decreased. Accordingly, the crystal grain size of the polysilicon thin film 8 is gradually decreased from the central portion of the channel region 10 to its edge portion on the drain electrode 4 side.

As mentioned above, in this embodiment, the irradiation position of the laser light L is moved stepwise by the distance d, whereby the amorphous silicon thin film 7 on the gate electrode 1 can have an irradiation amount distribution of the laser light L as shown in FIG. 7. That is, in this embodiment, the irradiation amount of laser light L for the source region 11 and the drain region 12 can become smaller than the channel region 10, and the source region 11 and the drain region 12 can be less crystallized (into polysilicon) than the channel region 10. As a result, in this embodiment, the polysilicon thin film 8 in the source region 11 and the drain region 12, respectively can have a smaller crystal grain size than the polysilicon thin film 8 in the channel region 10.

Note that the number n of shots of laser light L for laser annealing is preferably set to attain an irradiation energy sufficient to melt at least the entire amorphous silicon thin film 7 in the channel region 10.

As mentioned above, according to the TFT manufacturing process of the present invention, it is possible to manufacture, by means of a simple process, the TFT 18 of such a structure that the poly silicon thin film 8 in the source region 11 and the drain region 12, respectively has a smaller crystal grain size than the polysilicon thin film 8 in the channel region 10. Therefore, the thus-structured TFT 18 ensures that the electron mobility is smaller in the source region 11 and the drain region 12 of the semiconductor layer 2 than the channel region 10, and a leak current generated when the TFT is turned off can be reduced.

Note that it is preferred that the minimum irradiation area of the laser light L be smaller than a plane area of the channel region 10 as mentioned above, and the minimum irradiation area be irradiated with the maximum number of shots (multiple shots) of laser light. This embodiment allows multiple irradiation by switching apertures of the photo mask 21 to change the irradiation area of the laser light L as well as makes it easy to control the grain size distribution of the polysilicon thin film 8 in the channel region 10.

Next, a detailed description is given of the laser annealing method of the present invention, which includes the above laser annealing step. Focusing on one gate electrode 1, the case where the laser light L is irradiated in five shots for laser annealing is described below.

First of all, the conveyance means 13 starts conveying the TFT substrate 5 in the direction of arrow A in FIG. 1 at a constant speed under the control of the controller 17.

Next, the image capture means 16 captures images of the gate electrode 1 and the gate line 6 that are formed on the surface of the TFT substrate 5 through from the back of the TFT substrate 5. In this case, the images captured with the image capture means 16 are processed by the image processing unit 33, and the calculating unit 34 calculates the distance the TFT substrate 5 moves. Then, the control unit 36 executes control such that the moving distance matches a target value thereof stored in the memory 35, and the irradiation position of the laser light L corresponding to the aperture 25a of the most upstream aperture row 26 of the photo mask 21 in the conveyance direction is aligned with the preset, first irradiation position in an edge portion on the source electrode 3 side on the gate electrode 1.

At this time, when an offset occurs, the calculating unit 34 outputs the offset information to the alignment means drive controller 32. The alignment means drive controller 32 drives the alignment means 15 so as to correct the offset based on this offset information and slightly moves the photo mask 21 and the microlens array 22 together in the direction crossing the conveyance direction. As a result, the photo mask 21 and the microlens array 22 can move following the motions of the TFT substrate 5 in the direction crossing the conveyance direction, whereby the laser light L can be appropriately irradiated onto a predetermined position on the gate electrode 1. Note that the photo mask 21 and the microlens array 22 are let to move following the motions of the TFT substrate 5 all the time throughout the conveyance of the TFT substrate 5.

After the offset is corrected, for example, the calculating unit 34 outputs to the laser drive controller 31 a command to emit one pulse of laser light L. In response to the emission command received from the calculating unit 34, the laser drive controller 31 drives the laser 19 to emit one pulse of laser light L. The beam diameter of the laser light L emitted from the laser 19 is expanded by the coupling optical system 20, and its luminance distribution is homogenized. After that, the laser light L is irradiated to the photo mask 21.

Figure 8:
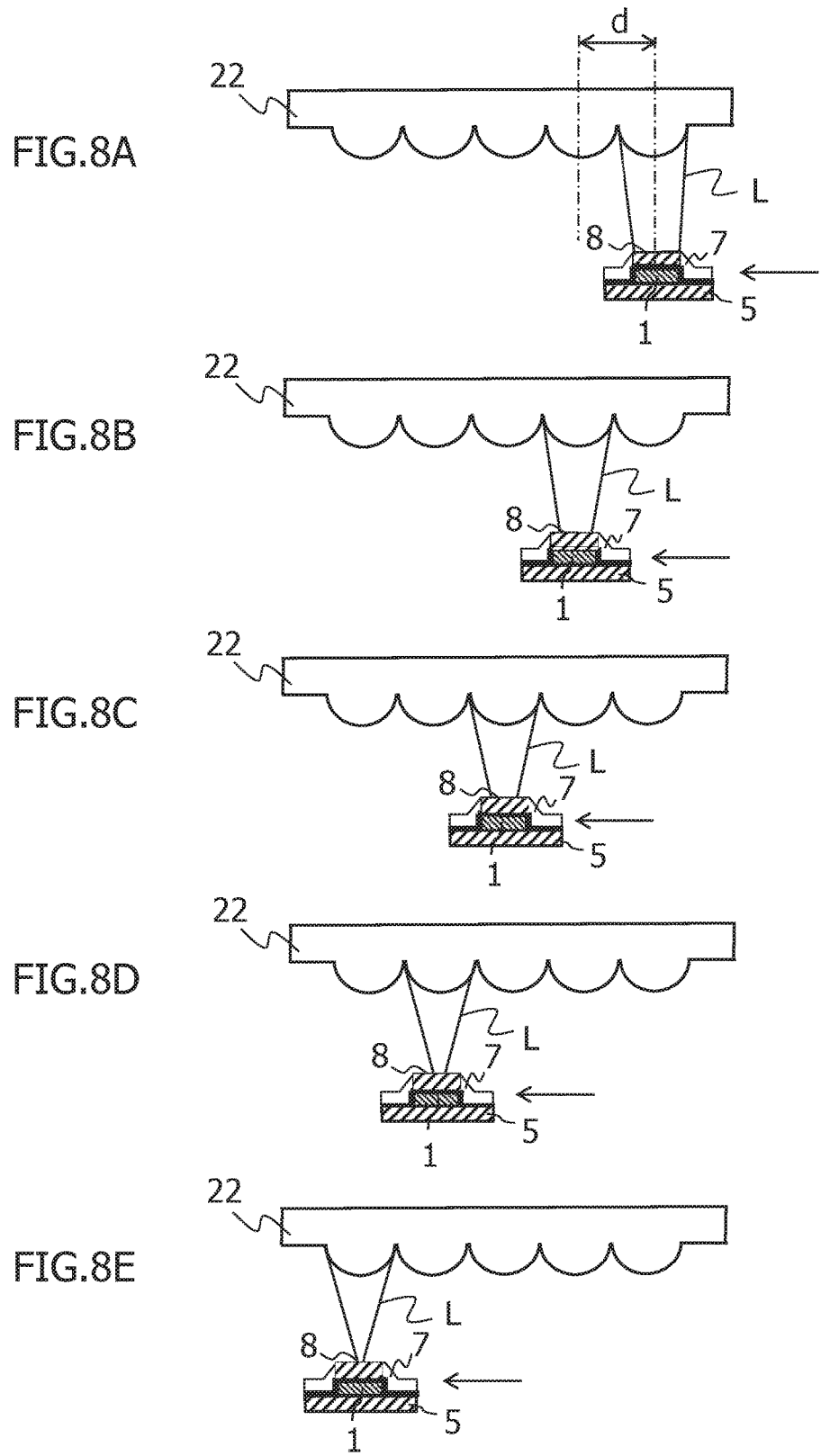
FIGS. 8A to 8E are explanatory views showing operations of the laser annealing method of the present invention.

FIGS. 8A to 8E are explanatory views illustrating operations in the laser annealing method of the present invention. The laser light L irradiated to the photo mask 21 is split into plural beams of laser light L through plural sets of apertures formed in the photo mask 21. Moreover, as shown in FIG. 8A, the plural split beams of laser light L are condensed to the first irradiation position by the microlens 27 disposed for each aperture in order to irradiate the amorphous silicon thin film 7 on the gate electrode 1. At this time, a reduced image of the aperture 25a is projected onto the amorphous silicon thin film 7, and a region of the same shape as the channel region 10 is illuminated by the laser light L. Hence, the amorphous silicon thin film 7, which is located at the first irradiation position and irradiated with the first shot of laser light L, is instantaneously heated and melted. Then, the amorphous silicon thin film 7 is partially crystallized into polysilicon.

The calculating unit 34 calculates the moving distance of the TFT substrate 5. Then, the TFT substrate 5 moves by the distance d equal to the array pitch $w_2$ of the gate electrodes 1 in the conveyance direction, which is stored in the memory 35. As shown in FIG. 8B, when the gate electrode 1 reaches a portion below the next, downstream microlens 27 in the conveyance direction, the calculating unit 34 outputs to the laser drive controller 31 a command to emit a second shot of laser light. In response to the command, the laser drive controller 31 drives the laser 19 to emit the second shot of laser light L.

The irradiation area of the second shot of laser light L is changed and then, the laser light L is condensed by the microlens 27 onto the amorphous silicon thin film 7 on the gate electrode 1 as shown in FIG. 8B. Being irradiated with the second shot of laser light L, the polysilicon thin film 8 at an overlap between the previous and current shots has a larger crystal grain size than the polysilicon thin film 8 in the other portions. More specifically, an overlap between the first and second shots (overlapped irradiation area of the laser light L) has been given a higher irradiation energy than the irradiation area of the first shot of laser light L, and at such an overlap, crystallization of the polysilicon thin film 8 proceeds.

From then on, as shown in FIGS. 8C to 8E, each time the TFT substrate 5 is conveyed by the distance d, the laser light L is emitted. In this way, the third to fifth shots of laser light L are irradiated to the polysilicon thin film 8 on the gate electrode 1.

As mentioned above, according to the laser annealing method of the present invention, the irradiation amount of laser light L increases as the number of overlapped shots increases upon the irradiation with the five shots, for example. Therefore, the crystallization (crystal growth) of the polysilicon thin film 8 further proceeds. As a result, the crystal grain size is larger in the polysilicon thin film 8 in the channel region 10 that has been exposed to a larger irradiation amount of laser light L than the polysilicon thin film 8 in the source region 11 and the drain region 12 that have been exposed to a smaller irradiation amount of laser light L. Thus, in the resultant semiconductor layer 2, the crystal grain size is smaller in the polysilicon thin film 8 in the source region 11 and the drain region 12 than the polysilicon thin film 8 in the channel region 10. Hence, the manufacturing process is not complicated, and a leak current generated when the TFT is turned off can be reduced through a simple process.

In the above embodiment, the size of each aperture of the photo mask 21 is changed by varying its width in the conveyance direction (X direction), not varying the width in the direction (Y direction) crossing the conveyance direction. However, the present invention is not limited thereto.

Figure 9:
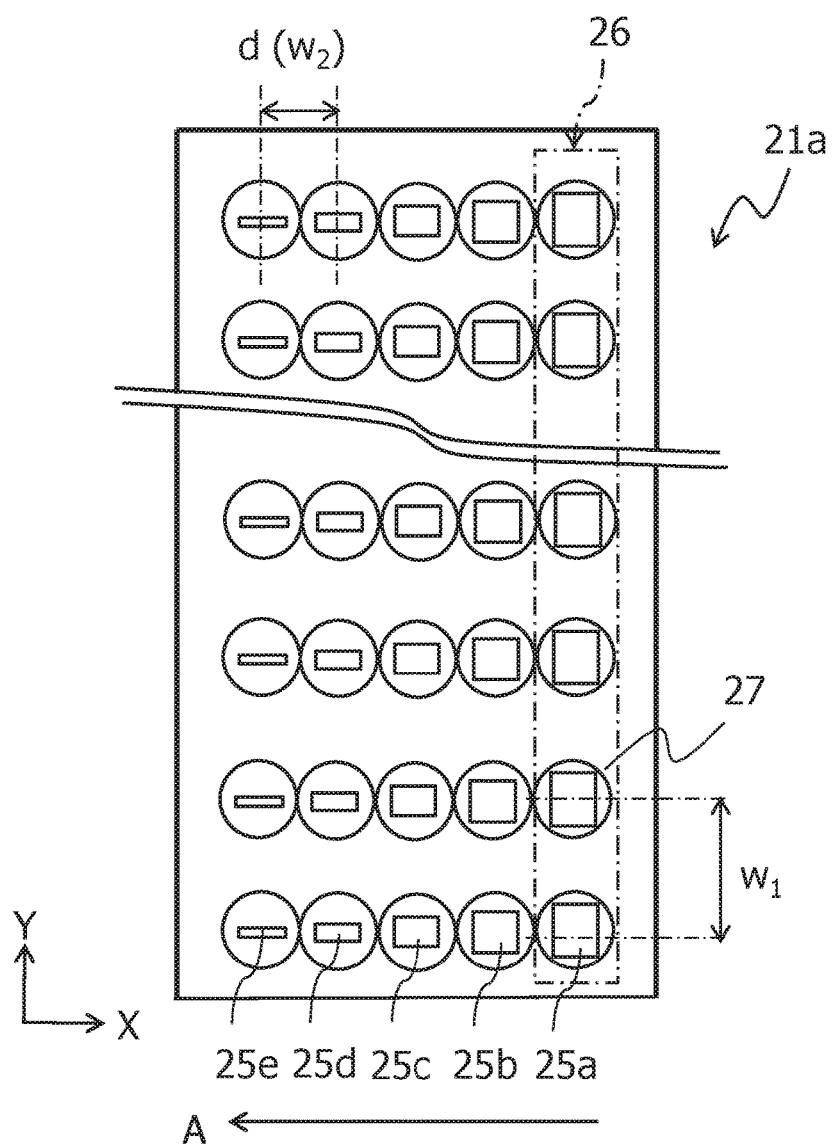
FIG. 9 shows a structural example of a photo mask used in the laser annealing apparatus of the present invention.

FIG. 9 shows a structural example of a photo mask used in the laser annealing apparatus of the present invention. A photo mask 21a of FIG. 9 is formed such that the apertures have different widths in the direction crossing the conveyance direction and have the same width in the conveyance direction so as to align the longitudinal direction of each aperture with the conveyance direction. More specifically, the aperture width in the direction crossing the conveyance direction is gradually decreased toward the downstream side in the conveyance direction. In the above embodiment, the TFT may be manufactured using the photo mask 21a.

FIGS. 10A to 10E are plan views illustrating an example of the TFT manufacturing process of the present invention. The TFT manufacturing process of FIGS. 10A to 10E is similar to the one of FIGS. 6A to 6E. That is, five shots of laser light L, for example, are irradiated for laser annealing. Note that in order to attain the same grain size distribution as in the TFT manufacturing process of FIGS. 6A to 6E, the layout of the TFT substrate 5 is turned clockwise by 90 degrees such that the source electrode 3, the channel region 10 and the drain electrode 4 are arranged in the direction crossing the conveyance direction (direction of arrow A).

Note that the image processing unit 33 detects as first detection information an edge portion (boundary of the gate electrode 1 in the X direction (for example, line e4 of FIGS. 10A to 10E)) of the gate electrode 1 in the conveyance direction from a luminance change in the conveyance direction based on image information captured by the image capture means 16, as well as detects as second detection information an edge portion (for example, lines e2 and e3 of FIGS. 10A to 10E) of the gate line 6 extending perpendicularly to the conveyance direction from a luminance change in the conveyance direction.

In this case, there is a possibility that an irradiation position accuracy in the conveyance direction (X direction) involves some offset of 1 micrometer or more to the right or left (X direction) in some situations, due to a delay of laser oscillation from the reception of the emission command sent by the laser drive controller 31. Also, the irradiation position may be shifted by 1 micrometer or more in some situations depending on the conveyance speed for the TFT substrate 5. To deal with the above problem, the alignment means drive controller 32 can control the irradiation accuracy in the direction (Y direction) crossing the conveyance direction on a submicron order. Thus, according to the TFT manufacturing process of FIGS. 10A to 10E, the offset of the center line C can be corrected with high precision and the irradiation accuracy is further enhanced for laser annealing.

Moreover, in the above embodiment, the crystal grain size distribution in the polysilicon thin film 8 has only to be set so as to reduce a leak current generated when the TFT is turned off. Therefore, the present invention is not necessarily limited to the laser annealing for the channel region 10 alone. Also, in the above embodiment, as shown in FIG. 6A, the irradiation width of the laser light L is reduced in stages, but the irradiation width of the laser light L can be increased in stages in such a layout that the photo mask 21 of FIGS. 3A and 3B is turned by 180 degrees.

It should also be understood that many modifications and variations of the described embodiments of the invention will be apparent to one skilled in the art without departing from the spirit and scope of the present invention as claimed in the appended claims.

What is claimed is:

1. A laser annealing method for irradiating laser light to an amorphous silicon thin film deposited on gate electrodes formed in a matrix at regular array pitches on a substrate so as to crystallize the amorphous silicon thin film into polysilicon as semiconductor layers on the gate electrodes, the method comprising:
the step of multiply irradiating the laser light while changing an irradiation area of the laser light on the amorphous silicon thin film to achieve such a grain size distribution that a crystal grain size of the polysilicon decreases from a central portion to a side edge portion at least along a center line of the irradiation area of the laser light, wherein the step of multiply irradiating the laser light is performed
- by using a photo mask having a plurality of apertures formed in a matrix at the array pitches of the gate electrodes, the matrix having rows each including apertures of the same size and extending in a direction crossing a conveyance direction of the substrate and columns each including apertures of different sizes and extending in the conveyance direction, and
- by irradiating the laser light sequentially through the rows of apertures by moving the substrate stepwise so that the laser light is irradiated through the apertures of different sizes in the photo mask and an irradiation width of the laser light changes in stages.

2. The laser annealing method according to claim 1, wherein the apertures of different sizes in the photo mask have different widths in the conveyance direction but have the same width as each other in the direction crossing the conveyance direction.

3. The laser annealing method according to claim 1, wherein the apertures of different sizes in the photo mask have different widths in the direction crossing the conveyance direction but have the same width as each other in the conveyance direction.

\* \* \* \* \*